(12) United States Patent
Dodabalapur et al.

(10) Patent No.: US 6,870,180 B2
(45) Date of Patent: Mar. 22, 2005

(54) ORGANIC POLARIZABLE GATE TRANSISTOR APPARATUS AND METHOD

(75) Inventors: Ananth Dodabalapur, Millington, NJ (US); Howard E. Katz, Summit, NJ (US); Rahul Sarpeshkar, Arlington, MA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/877,844

(22) Filed: Jun. 8, 2001

(65) Prior Publication Data

US 2002/0195644 A1 Dec. 26, 2002

(51) Int. Cl.[7] .......................... H01L 51/30; H01L 29/76
(52) U.S. Cl. .................. 257/40; 257/314; 257/405; 257/406; 257/410; 257/411
(58) Field of Search .................. 257/40, 225, 314–316, 257/405–406, 410–411, 321

(56) References Cited

U.S. PATENT DOCUMENTS

| | | | | |
|---|---|---|---|---|
| 4,851,370 | A | * | 7/1989 | Doklan et al. ............... 437/225 |
| 5,355,235 | A | * | 10/1994 | Nishizawa et al. ........... 359/59 |
| 5,467,308 | A | * | 11/1995 | Chang et al. .......... 365/185.01 |
| 5,563,424 | A | * | 10/1996 | Yang et al. ................... 257/40 |
| 5,835,169 | A | * | 11/1998 | Kwon et al. .................. 349/38 |
| 6,011,725 | A | * | 1/2000 | Eitan ...................... 365/185.33 |
| 6,309,907 | B1 | * | 10/2001 | Forbes et al. ............... 438/105 |
| 6,472,705 | B1 | * | 10/2002 | Bethune et al. ............. 257/314 |

OTHER PUBLICATIONS

Chen et al, "Antigenicity of Fullerenes: Antibodies specific for Fullerenes and their Characteristics", Proc. Nat'l Acad. Sci., 1998 (Sep. 1; 95 (18): 10809–'13 Immunology.*

Sze, S.M., "Physics of Semiconductor Devices", John Wiley & Sons, New York, Second Edition (1981), p. 499.*

"McGraw–Hill Dictionary of Scientific and Technical Terms", McGraw–Hill Publ. Co., Ed. Sybil P. Parker, Fifth Edition (ISBN 0–0 042333–4), p. 563 (1993).*

A. Dodabalapur, et al., "Organic smart pixels", *Applied Physics Letters*, vol. 73, No. 2, p. 142–144 (*1998*).

Paul Hasler and Paul D. Smith, An Autozeroing Floating-Gate Amplifier With Gain Adaptation, *IEEE International Symposium on Circuits and Systems VLSI 2 412* (*1999*).

Paul Hasler, Bradley A. Minch and Chris Diorio, "Floating-Gate Devices: They Are Not Just For Digital Memories Anymore", *IEEE International Symposium on Circuits and Systems VLSI 2, 388* (*1999*).

B. Crone, et al., "Electronic sensing of vapors with organic transistors",*Applied Physics Letters, vol. 78, No. 15, p. 2229 to 2231* (*2001*).

Tharaud O, et al., "Electrical characteristics improvements of organic MISFET by using ferroelectric (PZT) insulating layer", *Journal De Chimie Physique Et De Physico–Chimie Biologique, vol. 95 (6): 1363–1366* (*1998*).

\* cited by examiner

*Primary Examiner*—Nathan J. Flynn
*Assistant Examiner*—Johannes Mondt (57) ABSTRACT

An apparatus having a circuit coupled to the gate contact of field effect transistor wherein the transistor's gate includes a dielectric layer of which at least a portion is an organic dielectric. The circuit is configured to produce one or more storage voltage pulses that cause charge to be stored in the dielectric layer. The field effect transistor has a semiconductor layer with a conductive path whose conductivity changes for a given $V_g$ in response to storing the charge. The circuit may produce one or more dissipation voltage pulses having a voltage of opposite sign to the one or more storage pulses, that cause dissipation of charge stored in the dielectric layer. Further disclosed are a memory and a method of electronically storing and reading information, both utilizing the organic-based polarizable gate transistor apparatus.

31 Claims, 7 Drawing Sheets

ORGANIC POLARIZABLE GATE TRANSISTOR APPARATUS AND METHOD

FIELD OF THE INVENTION

The invention relates to organic-based electronic devices and more particularly to organic polarizable gate transistors.

BACKGROUND OF THE INVENTION

It is known in the art to fabricate electronic circuits from organic materials. Benefits include inexpensive processing and large coverage area. Field-effect transistors (FETs) with organic semiconductor channels have been fabricated in arrays to drive electrophoretic display pixels and polymer dispersed liquid crystal-based displays. Complimentary logic elements and shift registers containing hundreds of organic-based FETs have been produced. The source and drain electrodes of individual FETs have been patterned using microcontact printing to give exceptional aspect ratios. Device architectures have been developed to minimize deposition and processing steps.

SUMMARY OF THE INVENTION

There is a need for an organic polarizable gate transistor and additionally, to utilize such a transistor in an appropriately configured circuit.

Embodiments of the invention provide an organic-based polarizable gate transistor apparatus. The apparatus has a circuit coupled to a gate contact of an FET. The FET's gate includes a dielectric layer, wherein at least a portion of the layer is an organic dielectric. The circuit is configured to produce one or more storage voltage pulses that cause charge to be stored in the dielectric layer. The FET may have a semiconductor layer with a conductive path whose conductivity changes for a given $V_g$ in response to storing the charge. The circuit may be configured to produce one or more dissipation voltage pulses having a voltage of opposite sign to the one or more storage pulses, that cause dissipation of charge stored in the gate dielectric layer.

Additional embodiments of the invention include a memory and a method of electronically storing and reading information, both utilizing the organic-based polarizable gate transistor apparatus.

DESCRIPTION OF THE DRAWINGS

The invention is best understood from the following detailed description when read with the accompanying drawings.

DETAILED DESCRIPTION OF THE INVENTION

A polarizable gate transistor may be used as an information storage device and as an element in adaptive, synaptic, and amplifying circuits. Charge storage or polarization between the transistor's gate contact and semiconductor channel imposes an added voltage between the gate contact and channel, thereby altering the effective channel voltage relative to the voltage nominally applied at the gate contact ("gate voltage" or "$V_g$").

Embodiments of the invention modify organic-based transistors to operate as a polarizable gate transistor wherein the effective gate voltage applied to its channel is shifted relative to $V_g$. A primary advantage is the creation of additional device states, which can be read as stored information. Furthermore, polarizable or altered gate devices can function more effectively in certain circuits. The effective threshold voltage $V_t$ can be brought very close to zero for applications where the available gate voltage is limited. The transconductance of the device can be increased, since the apparent $V_g$ necessary to produce a given drain current can be reduced. Resonant and adaptive circuits can be tuned in situ through polarizable gates, pseudo CMOS circuits can be fabricated from transistors of one carrier type, and the sensory properties of organic FETs may be optimized or diversified.

Embodiments of the invention provide a circuit configured to operate an organic polarizable gate device. In particular, circuits are disclosed that operate a field effect transistor (FET) with an organic gate dielectric as a polarizable gate device. The polarizable gate FET stores data in its gate-charged state. Advantageously, the circuits can be constructed with organic reel-to-reel technology, which is relatively inexpensive and may be useful to construct memory devices. This is an attractive alternative to fabrication processes which require vacuum technology which entails removing a work piece from an assembly line to insert it into a vacuum chamber. In reel-to-reel technology, material may be deposited instead via a liquid medium.

Figure 1:
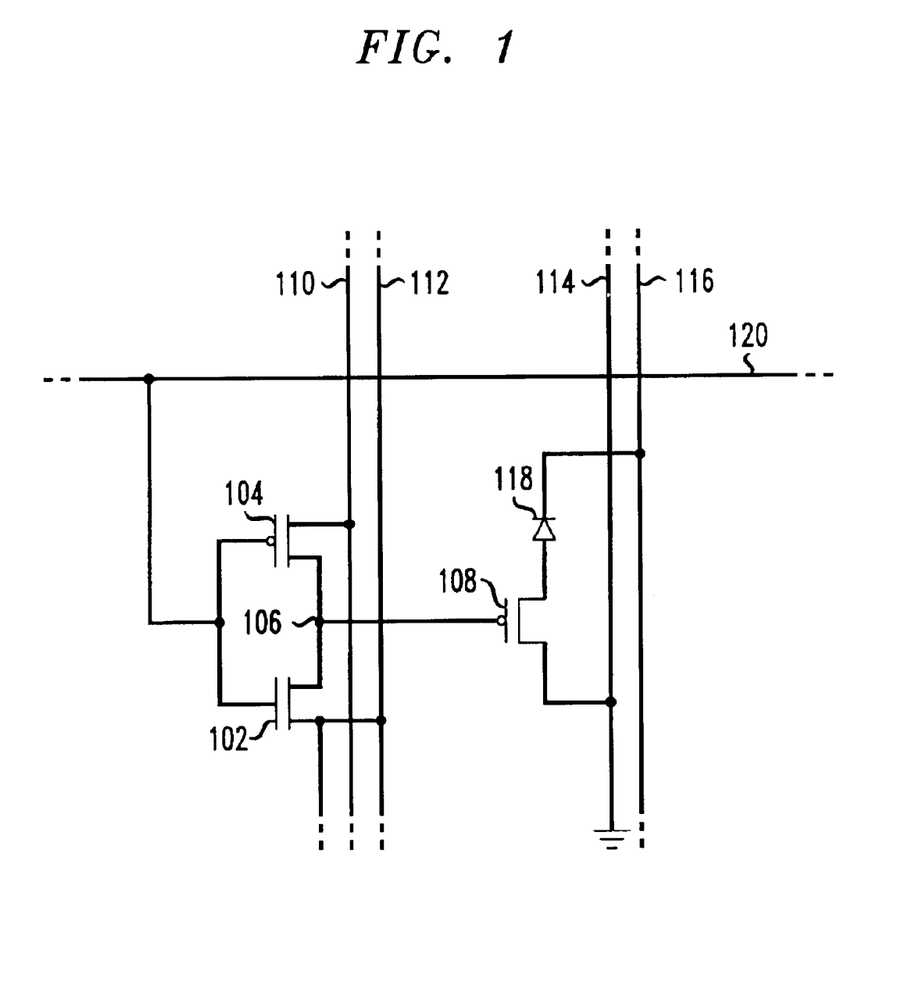
FIG. 1 depicts a pixel circuit according to an illustrative embodiment of the invention.

Numerous circuit types are possible according to illustrative embodiments of the invention. Exemplary embodiments include circuit types such as CMOS compatible floating gate elements, analog memory elements, capacitor-based circuits, adaptive circuits and learning networks which may be used in conjunction with organic polarizable gate transistors. FIG. 1 depicts a pixel circuit according to an illustrative embodiment of the invention. The circuit comprises FETs 102 and 104 configured as an inverter. The output 106 of the inverter is connected to the gate of a third FET 108 which functions as a memory element. FET 108 is polarizable and has a dielectric layer of which at least a portion is an organic dielectric. Rows 110 and 112 provide inputs into FETs 104 and 102, respectively. Row 110 switches between 0V and +100V. Row 112 switches between 0V and −100V. Row 114 provides a ground. FET 108 is connected to a diode 118, such as an organic light emitting diode (LED). Row 116, which switches between −20V and ground, is connected to diode 118. When a particular row is selected, row 110 is at 100 V and row 112 is at −100 V. When any other row is selected, rows 110 and 112 are at 0 V.

Column 120 values are entered by pulses to drive the gate of FET 108 to either 100 V or −100 V. When this is done, row 116 is held to ground to avoid excessive current flow in the LED. To enter a voltage of 100 V in the gate of FET 108, a pulse of −100 V is applied. When a row is not selected, the inverter comprising FETs 102 and 104 provides isolation by keeping the gate of FET 108 at or near 0 V. The voltage of row 116 is switched to −20 V after the row is addressed and not during the addressing of the particular row. In this mode the LED device experiences normal current flow. This design has immunity to charge injection effects so that capacitive currents are not likely to cause a change in the state of FET 108.

The exemplary embodiment depicted in FIG. 1 is optimized for organic LEDs integrated with organic FETs. The design principle, however, may be extended to other types of circuits and display elements such as liquid crystals, electrophoretic devices and electrochromic devices. In such cases some modifications to the pixel circuitry may be needed. For example, the addressing scheme may be varied or the circuit may be configured as a voltage source as opposed to a current source.

EXPERIMENTAL EXAMPLES

The semiconductors 1,4-bis (5-phenyl-2-thienyl) benzene (PTPTP) and N,N'-bis (1H, 1H-perfluorooctyl) naphthalene-1,4,5,8-tetracarboxylic diimide (F15-NTCDI) were prepared using standard methods. They were chosen because they typically exhibit $V_t$ substantially in the accumulation regime (negative for the p-channel PTPTP and positive for the n-channel F15-NTCDI). Three dielectric materials were used: glass resin and two particularly hydrophobic polymers, poly(4-methylstyrene) (P4MS) and cyclic olefin copolymer, such as TOPAS® obtained from Ticona Corporation. Hydrophobic polymers were expected to be preferred as charge storage (electret) media. Polymer dielectric films of 1–2 micron thickness were spin-coated, Glass resin as received and the others from mesitylene or xylene, onto indium tin oxide-coated glass substrates that had been polished with fine celite, cleaned with water and acetone, and for TOPAS®, primed with phenyltrimethoxysilane. Semiconductor films and gold source/drain electrodes were sublimed at high vacuum.

TABLE I

Characteristics of PTPTP Floating Gate Devices

| Dielectric | $V_w$ | Time (min) | $V_t$ | $\mu$ (cm$^2$/Vs) | turnon |
|---|---|---|---|---|---|
| P4MS | 0 | — | −20 | 0.007 | shallow |
| " | +50 | 1 | 0 | 0.01 | shallow |
| " | +100 | 1 | +10 | 0.02 | shallow |
| Glass resin | 0 | — | −30 | 0.02 | sharp |
| " | +50 | 1 | −20 | 0.02 | sharp |
| " | +100 | 1 | −15 | 0.02 | sharp |
| " | +200 | 1 | −10 | 0.02 | sharp |
| " | +200 | 10 | 0 | 0.02 | sharp |
| " | −200[a] | 10 | −25 | 0.02 | sharp |
| " | 0[a] | 20[b] | −20 | 0.02 | moderate |
| TOPAS® | 0 | — | −35 | 5 × 10$^{-5}$ | — |
| " | +50 | 10, 25 | −10[c] | 10$^{-4}$ | — |
| " | +100 | 10, 25 | +20 | 2 × 10$^{-4}$ | — |
| " | +200 | 10, 25 | +60[d] | 4 × 10$^{-4}$ | shallow |

[a]reversal of +200 V/10 min devices. [b]heated to 140 deg C., then cooled. [c]stable to cycling 90 min between 0 and −100 V operation. [d]stable to cycling 10 min between 0 and −100 V operation.

TABLE II

Characteristics of F15-NTCDI Floating Gate Devices

| Dielectric | $V_w$ | Time (min) | $V_t$ | $\mu$ (cm$^2$/Vs) | turnon |
|---|---|---|---|---|---|
| P4MS | 0 | — | +30 | 0.001 | moderate |
| " | −100 | 10 | +30 | 0.001 | moderate |
| " | −200 | 10 | −30 | 6 × 10$^{-4}$ | moderate |
| " | +150 | 10[a] | 0 | 4 × 10$^{-4}$ | moderate |
| Glass resin | 0 | — | −20 | 0.02 | shallow |
| " | −100 | 10 | −20 | 0.02 | shallow |
| " | −200 | 10 | −20 | 0.02 | shallow |
| TOPAS® | 0 | — | +50 | 3 × 10$^{-5}$ | — |
| " | −50 | 10 | +30 | 2 × 10$^{-5}$ | — |
| " | −100 | 10 | +10 | 2 × 10$^{-5}$ | — |
| Glass resin/ TOPAS® | 0 | — | −40 | 7 × 10$^{-4}$ | moderate |
| " | −50 | 10 | −100 | 5 × 10$^{-4}$ | shallow |

Figure 2A:
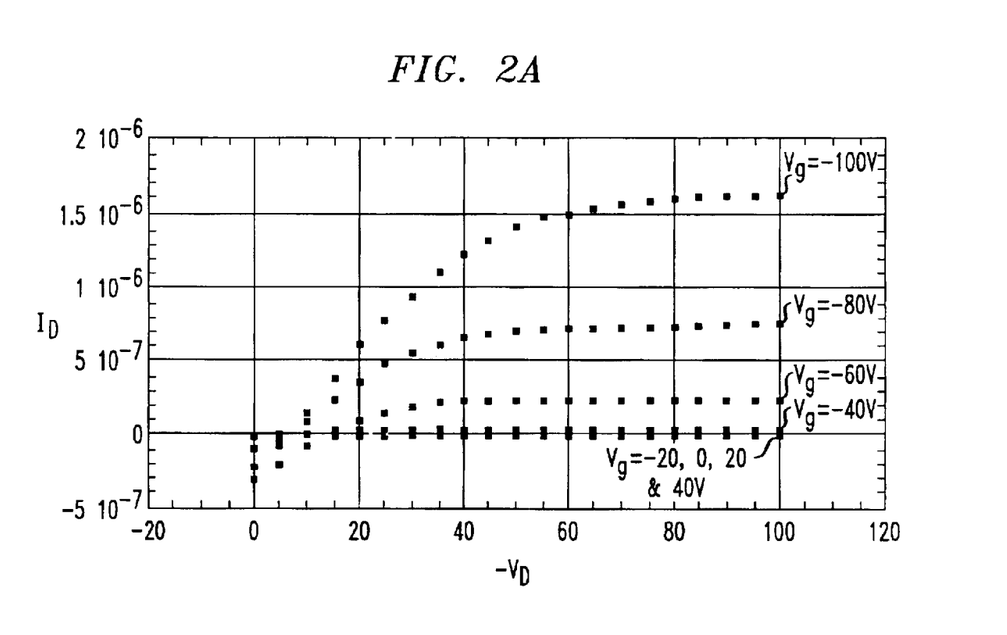
FIGS. 2A–B depict current-voltage plots for 1,4-bis (5-phenyl-2-thienyl) benzene on glass resin as prepared, and after applying a depletion voltage, respectively.
Figure 2B:
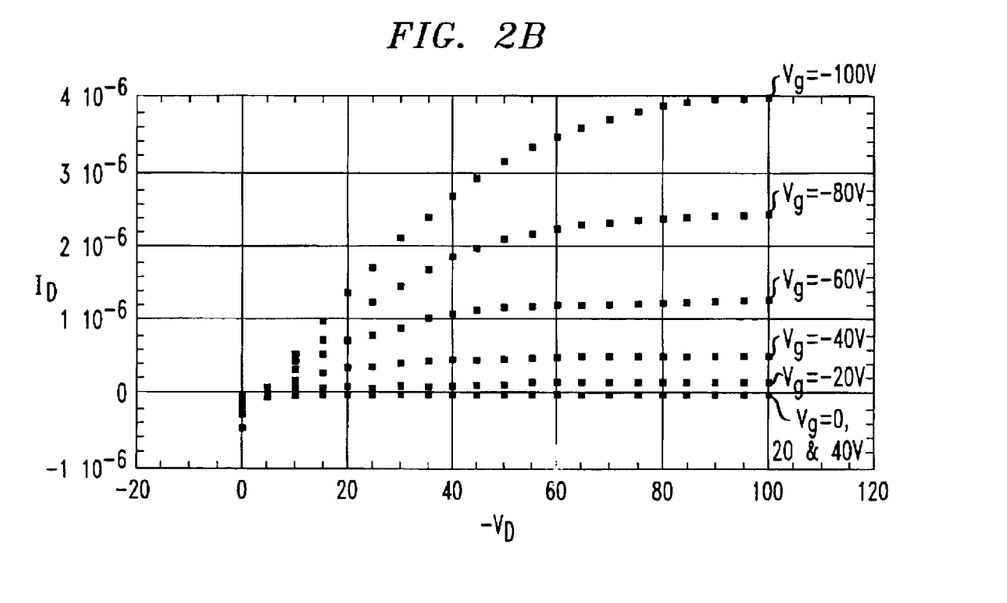
Figure 3A:
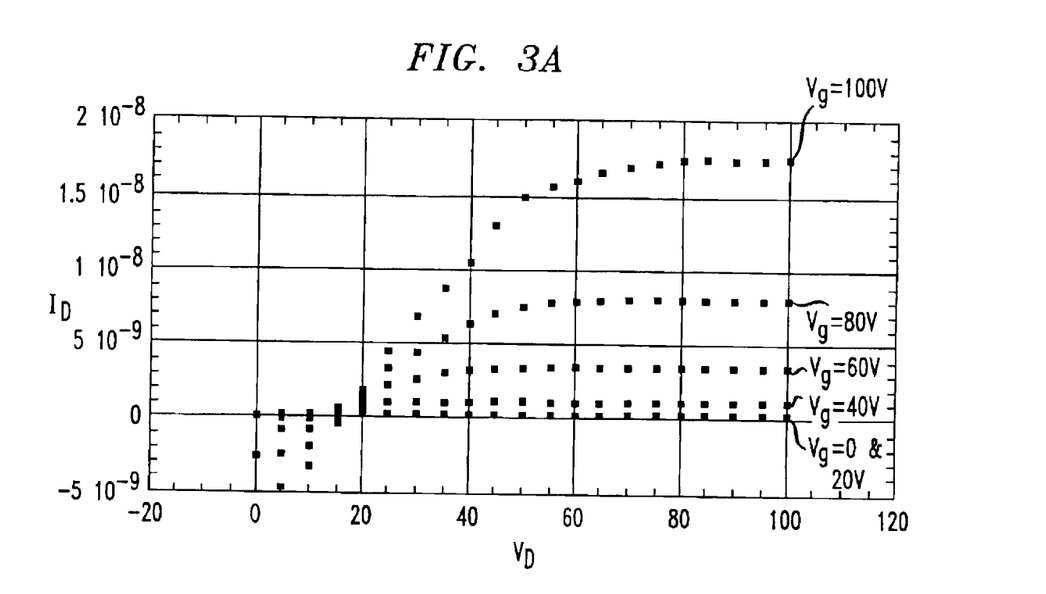
FIGS. 3A–B depict current-voltage plots for N,N'-bis (1H, 1H-perfluorooctyl) naphthalene-1,4,5,8-tetracarboxylic diimide on hydrophobic polymers, poly(4-methylstyrene) as prepared, and after applying a depletion voltage.
Figure 3B:
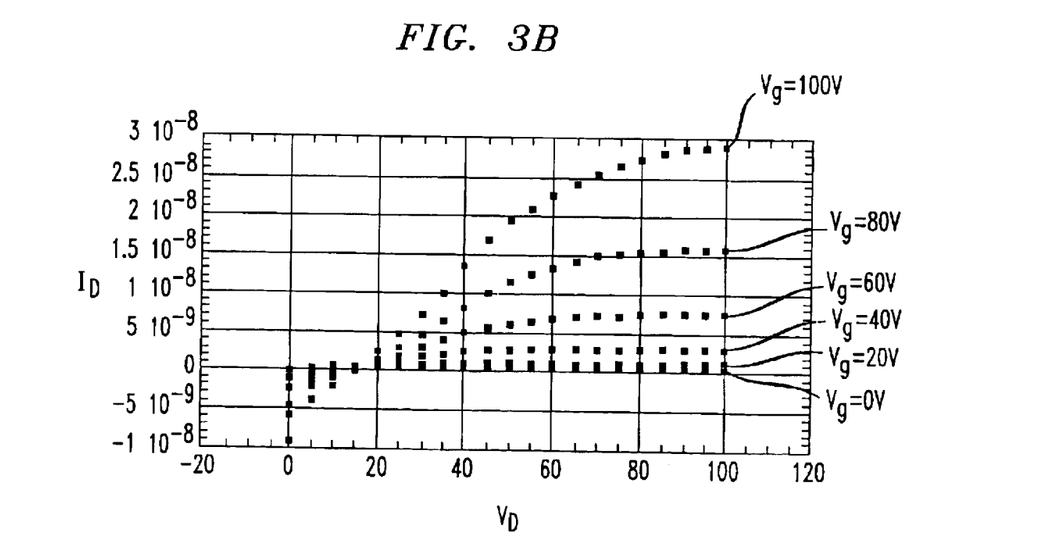

Representative device characteristics before and after writing the polarizable gate voltages are listed in Tables I and II, and illustrated in FIGS. 2A–B and 3A–B, for p-channel and n-channel operation, respectively. FIG. 2A shows a current-voltage plot for PTPTP on Glass resin as prepared. FIG. 2B shows a current-voltage plot for PTPTP on Glass resin after applying a nominal 200-V depletion voltage for ten minutes. $V_g$ ranges from +40 V (lowest currents) to −100 V in 20-V increments. All currents below $V_t$ are essentially zero. FIGS. 3A–B depict current-voltage plots for F15-NTCDI on P4MS. FIG. 3A depicts the plot for the device as prepared. FIG. 3B depicts the device characteristics after applying a 200-V depletion voltage for ten minutes. $V_g$ ranges from 0 V (lowest currents) to +100 V in 20-V increments. Writing voltages $V_w$ were applied via the gate relative to a common source and drain voltage. Threshold voltages are reported as the gate voltage at which the square root of the source-drain saturation current ($I_d^{0.5}$) begins to increase substantially. For devices with good subthreshold characteristics and a sharp turnon, this voltage is the x-intercept of the plot of $I_d^{0.5}$ vs $V_g$, and can be estimated to within 5 V. In cases where there is significant leakage or shallow turnon, $V_t$ is defined as the $V_g$ at which the apparent mobility reaches 25% of the maximum mobility observed in that device, and the uncertainty is 10 V.

For all three dielectrics, PTPTP devices were brought from accumulation mode turnon to zero or depletion mode turnon by writing with a depletion voltage. NTCDI-F 15 devices showed significant turnon voltage shifts toward depletion with the two hydrocarbon dielectrics. The best-behaved system was PTPTP on Glass resin because of the predictability of the threshold voltage shift, consistency in mobility, and sharp turnon characteristics. The fall effect of writing was generally observable for about one hour after writing, and could be rapidly reversed by either applying an accumulation voltage or by heating. Stored charge was retained better when the device was heated during writing. The TOPAS® showed good charge storage capability, and the PTPTP devices on that dielectric were stable to hundreds of on/off cycles through the accumulation mode. However, the TOPAS® surface was not conducive to high mobility film growth. This was remedied to some extent by forming a two-layer dielectric, with TOPAS® as the charge storage layer and Glass resin as the semiconductor interface layer.

Figure 7:
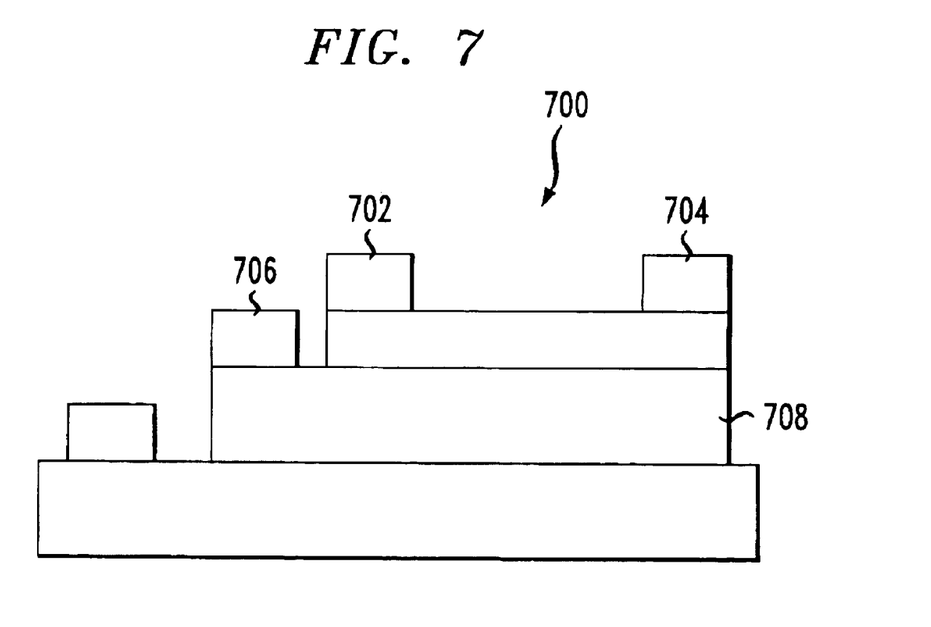
FIG. 7 depicts a transistor with an illustrative auxiliary electrode configuration.

The writing voltage was generally applied from the source-drain electrodes, but it was also possible to use an adjacent auxiliary electrode to perform the writing operation. FIG. 7 depicts an FET 700 with an illustrative auxiliary electrode configuration. In addition to a source electrode 702 and a drain electrode 704, FET 700 includes an auxiliary electrode 706. FIG. 7 shows auxiliary electrode 706 positioned on a dielectric layer 708, however, other configurations are possible which are known to those skilled in the art. Small amounts (100 ppm) of electroactive additives in the dielectric had modest effects on the charge storage phenomena. For example, the addition of 2,3-dichloro-5,6-dicyanoquinodimethane slightly diminished, and 5,5'''-dihexyl-α-quinquethiophene slightly increased the capability of PTPTP/P4MS devices to store and retain an applied depletion voltage.

The stored voltages are the result of injected static charges and/or induced dipole orientation at or between the two interfaces of the gate. The effect produced by additives in the dielectric indicates that at least some of the charge may be stored in the bulk of the dielectric. Also, in some embodiments, hydrocarbons are also effective as charge storage media. However, the possibility that a substantial fraction of the imposed voltage is imprinted at an interface cannot be ruled out. In particular, the formation or rearrangement of dipoles at the dielectric-semiconductor interface would have a profound effect on the trap-filling and channel-formation processes that are necessary for the transistor to reach a decidedly on state.

Figure 4A:
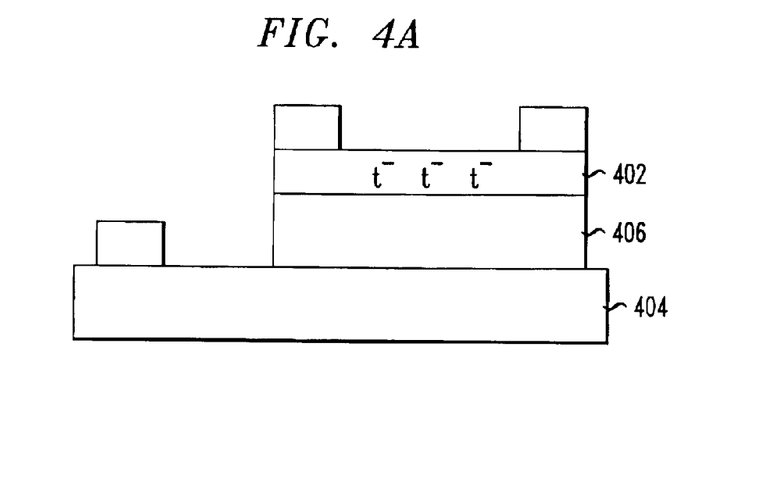
FIGS. 4A–E depict non-polarizable and polarizable gate operation of a p-channel FET with hole traps.
Figure 4B:
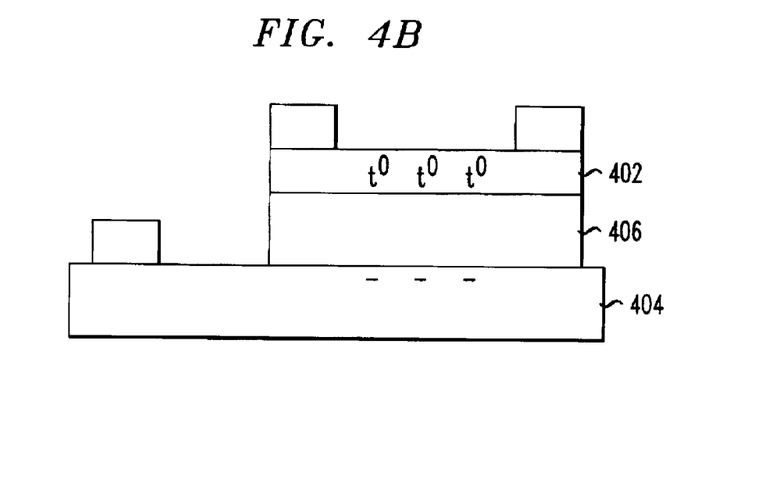
Figure 4C:
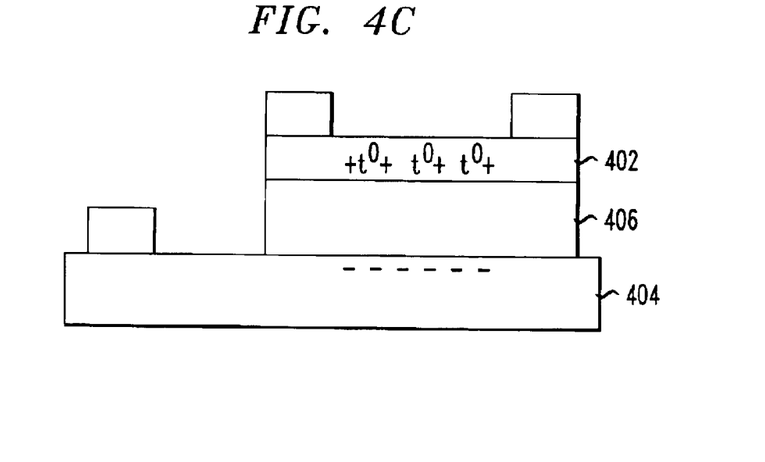
Figure 4D:
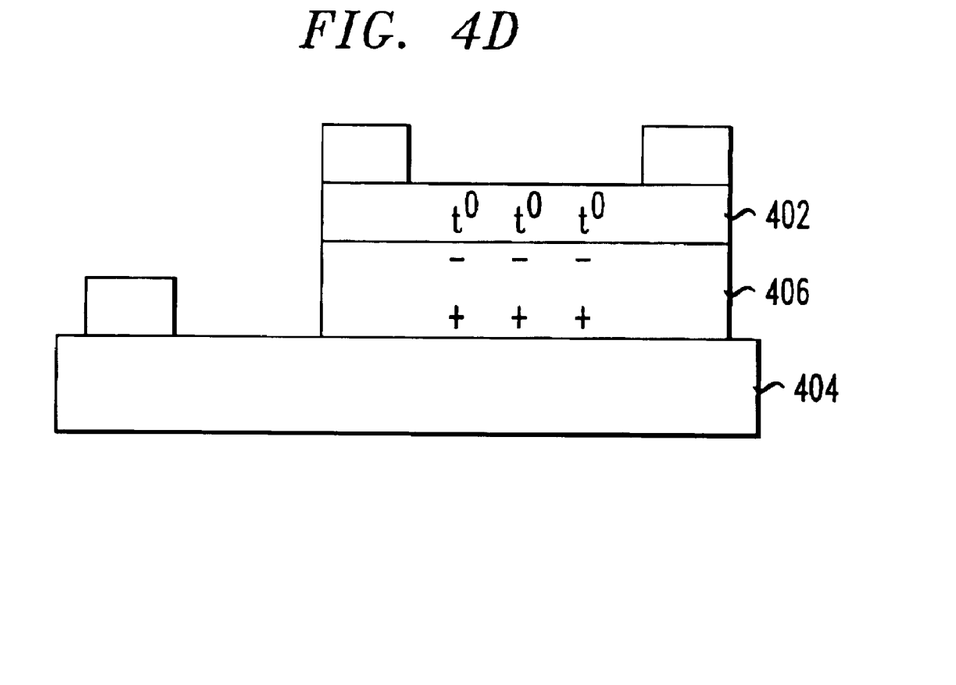
Figure 4E:
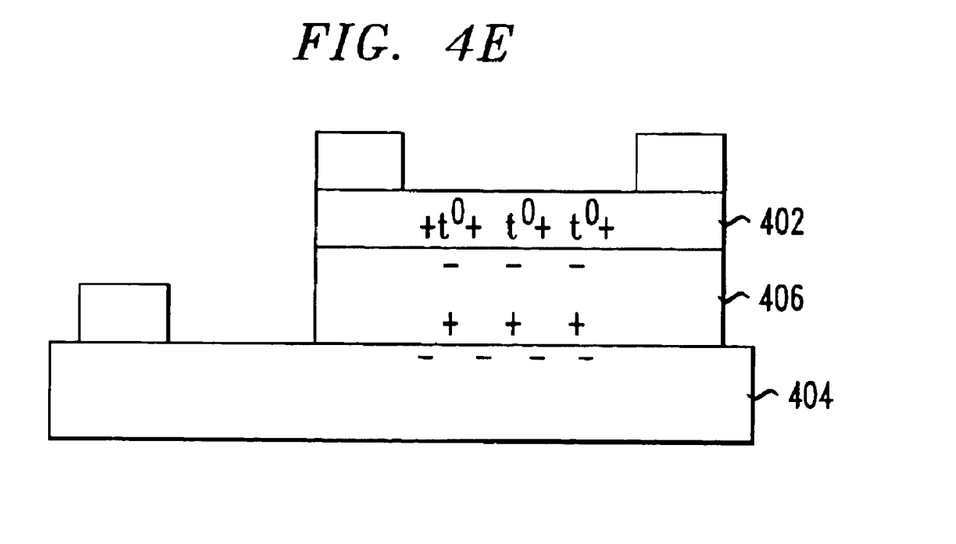

Voltage pulses that have the same sign as a gate voltage that would cause depletion result in the shift of the effective channel voltages in the direction of accumulation relative to the actual applied $V_g$. This suggests that charges of sign opposite that of the majority carrier are injected into the dielectric during depletion voltage writing near the semiconductor-dielectric interface, enabling more efficient filling of traps and establishment of the channel by majority carriers in the semiconductor. This is illustrated schematically in FIGS. 4A–E. FIG. 4A depicts a p-channel FET with hole traps in semiconductor layer 402. Non-polarizable gate operation is depicted in FIGS. 4B–C. In FIG. 4B, an initial accumulation voltage neutralizes the traps. As shown in FIG. 4C, additional accumulation voltage, produced by ions in semiconductor layer 402 and oppositely charged ions in substrate 404, creates a channel. Polarizable gate operation is depicted in FIGS. 4D–E. In FIG. 4D, depletion voltage stored in dielectric layer 406 causes trap neutralization. FIG. 4E shows a channel created by the initial accumulation voltage.

In an illustrative embodiment, the inventive apparatus includes a circuit having an output coupled to an FET gate. The gate includes a gate contact, a dielectric layer and a path from the gate contact to the dielectric layer. The dielectric layer has at least a portion comprising an organic dielectric. The circuit is configured to produce one or more storage voltage pulses that cause charge to be stored in the gate dielectric layer. Charge may be stored anywhere within the gate, and may be permanent or non-permanent. In an exemplary embodiment, charge is stored within at least a portion of the dielectric layer, which may be for example, the organic dielectric layer. In another illustrative embodiment charge is stored at a boundary of the dielectric layer. The FET may have a semiconductor layer with a conductive path, such as a channel, whose conductivity changes for a given $V_g$ in response to storing the charge. In general, the conductive path is a path between electrodes of the FET, for example, between the source and drain.

Figure 5A:
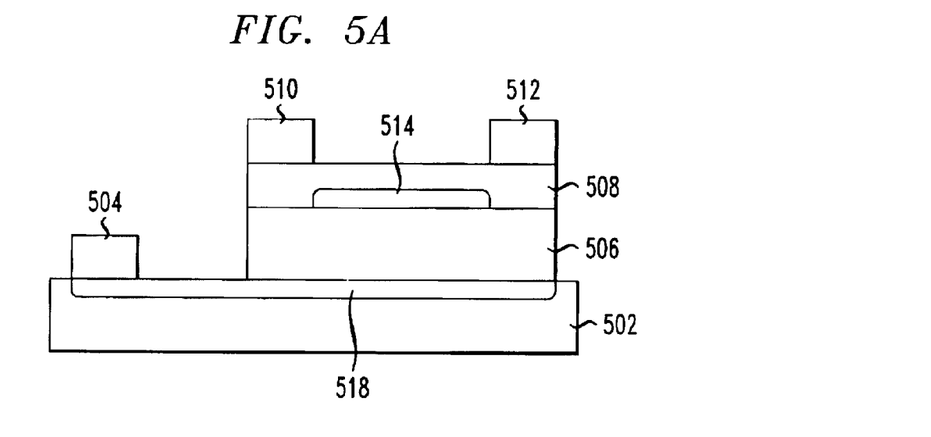
FIGS. 5A–C depict schematic representations of polarizable gate transistors and charge storage therein.
Figure 5B:
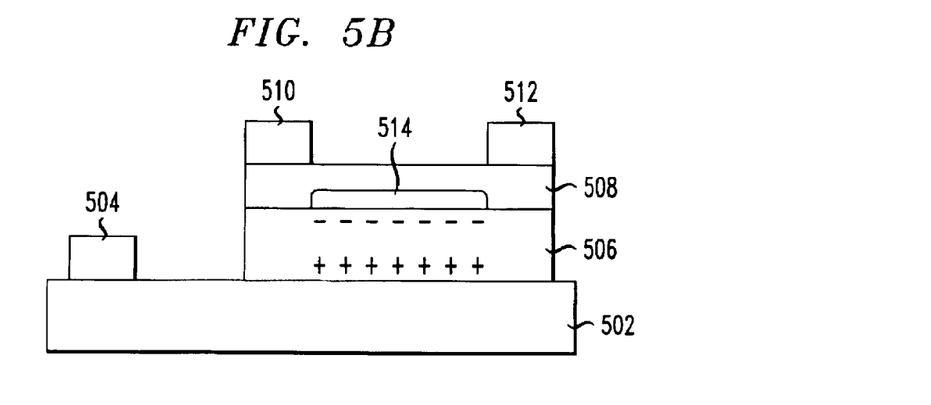
Figure 5C:
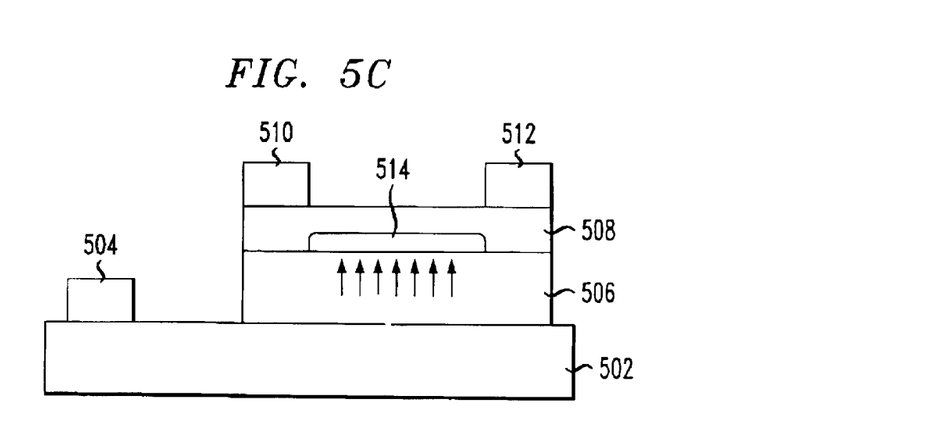

FIGS. 5A–C depict schematic representations of a polarizable gate transistor according to an illustrative embodiment of the invention. FIGS. 5A–B show charge storage in polarizable gate transistors. FIGS. 5A–C show a substrate 502 having a gate. The gate includes a dielectric layer 506 disposed on substrate 502. As used herein "gate dielectric" or "dielectric layer" includes a gate dielectric of one or more layers. The organic dielectric portion of dielectric layer 506 may be all or part of a single layer or layers. Dielectric layer 506 may also include one or more metal layers. The gate further includes gate contact 504 and a path from gate 504 to dielectric layer 506. Optionally, the gate may include a gate lead 518 that connects gate contact 504 to gate dielectric 506 and serves as the path as shown in FIG. 5A. Gate lead 518 may not be needed, for example, if at least a portion of substrate 502 is conductive or gate contact 504 interfaces with dielectric 506. A semiconductor layer 508 is disposed on dielectric layer 506. A source electrode 510 and a drain electrode 512 are located on semiconductor layer 508. A channel 514 comprises at least a portion of semiconductor layer 508. As used herein, a "portion" may consist of as little as a part of a single layer of molecules. The charge may be stored in domains within the bulk of the dielectric, or at interfaces between a gate contact 504 and a conductive path formed between source 510 and drain 512. The stored charge may cause a polarization of the dielectric. The conductive path may include some or all of semiconductor layer 508. The conductive path is only conductive at a range of gate voltages or above a threshold gate voltage. As shown in FIG. 5B, charge carriers may be stored individually within dielectric 506. Alternatively, as shown by arrows in FIG. 5C, dipoles may create a polarization of the dielectric.

The circuit may be configured to produce one or more dissipation voltage pulses that cause dissipation of charge stored in the gate. The one or more dissipation pulses have a voltage of opposite sign to the one or more storage pulses. In an illustrative embodiment of the invention the one or more storage and the one or more dissipation voltage pulses correspond to voltages whose magnitudes are at least three times as large as the voltage that causes the channel to conduct.

Charge dissipation may also be accomplished in certain dielectrics by applying energy. The energy may be in any form that can be produced by the circuit and is compatible with the FET and its operation. In an illustrative embodiment of the invention, the energy is in the form of heat and/or light.

The circuit may also produce gate voltage pulses that change the conductivity of the channel, e.g., by at least a factor of ten. The gate voltage, however, that produces such a conductivity change is dependent on the geometry of the device. In particular, the gate dielectric thickness may be influential. In an exemplary embodiment of the invention, the circuit produces a voltage pulse, wherein the ratio of the voltage to thickness of the organic gate dielectric is in the range of about 10V/1 $\mu$ to about 200V/1 $\mu$.

The dielectric layer may include a charge storage layer utilized to store charge. The layer may be interposed between the gate contact and channel. In an exemplary embodiment, the charge storage layer is hydrophobic. In an illustrative example, the charge storage layer is selected from the group consisting of cyclic olefin copolymer, Glass resin and poly 4-methyl-styrene. Further examples include $TiO_2$-polysiloxane composites, zinc octaethylporphyrin films, anthracene-methacrylate copolymers, and poly(methylmethacrylate) (PMMA). Poly-tetraflouroethylene, copolymers of substituted styrenes and other hydrophobic monomers, and composites of polymers with particles or pores that retain static charges may also be used as a charge storage layer. Other organic-based charge storage materials may be used that are compatible with FET fabrication processes and operation. Advantageously, a microcontactlike process, for example, where electrodes mounted on a rubber stamp are used to deliver the one or more volatge pulses, may be used to supply the voltage pulses. Such techniques have been used with PMMA in devices other than FETs, but not in FETs. Other exemplary methods of providing voltage pulses include corona discharge and ion implantation. Energy may be applied during the charging to facilitate charge entry.

Figure 6:
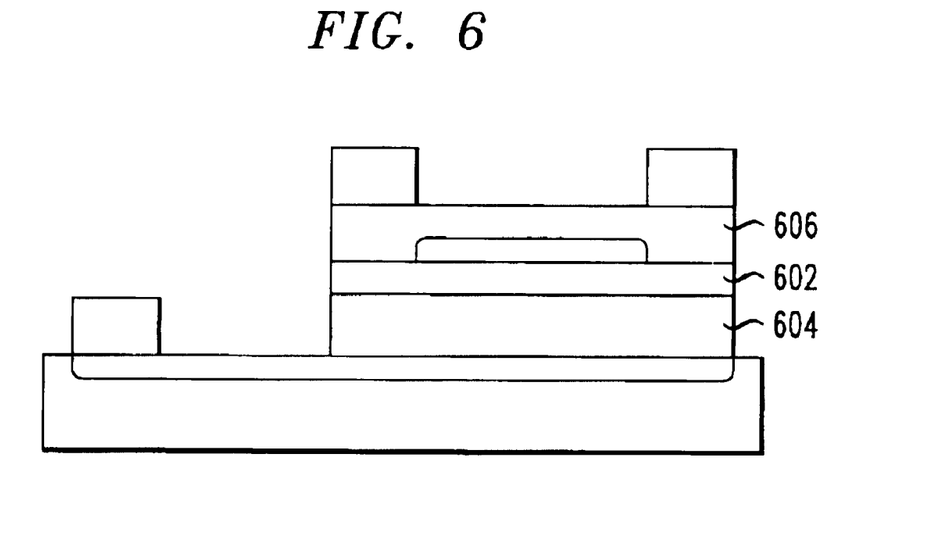
FIG. 6 depicts a transistor according to an illustrative embodiment of the invention.

The dielectric layer may also include a semiconductor interface layer. FIG. 6 depicts a transistor according to an illustrative embodiment of the invention. Semiconductor interface layer 602 is disposed between dielectric layer 604 and semiconductor layer 606. Semiconductor interface layer 602 may be a separate layer or a modification to a portion of dielectric layer 604. For example, oxygen plasma or other chemical oxidation methods may be used to modify the surface of dielectric layer 604 to form an interface layer 602. In an illustrative embodiment of the invention, interface layer 602 may be a self assembled monolayer or a polymer. In a further example, the semiconductor interface layer is a Glass resin. Cyclic olefin copolymer and the Glass resin may be used together to form the gate dielectric, wherein the cyclic olefin copolymer forms the charge storage layer and the Glass resin serves as a semiconductor interface layer.

As provided in the examples, the FET channel may include PTPTP or F15-NTCDI as an organic semiconductor. The channel, however, is not limited to these organic compounds. Other illustrative organic semiconductors include, phenylene-thiophene oligomers, for example, 5,5'-diphenyl-2,2'-bithiophene, 5,5''-diphenyl-2,2',5',2''-terthiophene; 5,5'''-diphenyl-2,2',5',2'',5'',2'''-quaterthiophene; and 1,4-bis (5'-hexyl-2,2'-bithien-5-yl)benzene. An illustrative example of another NTCDI compound is N,N'-bis(2,2,3,3,4,4,4-heptafluorobutyl)naphthalene-1,4,5,8-tetracarboxylic diimide. Other illustrative examples include, thiophene-thiazole oligomers, for example 2,5-bis(2,2'-bithien-5-yl)thiazole and 5,5'-bis(5'-hexyl-2,2'-bithien-5-yl)2,2'-bithiazole; and benzodithiophene-based compounds, for example, 2,2'-bis (benzo-1,2-b:4,5-b'-dithiophene). Other organic materials that have properties desirable for an organic semiconductor channel are phenylene oligomers and co-oligomers and copolymers of thiophene and fluorene.

In a further embodiment of the invention, the apparatus includes a memory cell wherein the transistor is an information storage device of the cell. The invention further comprises a memory having a plurality of such memory cells. Still further the invention includes a memory wherein at least one channel of at least one memory cell in the memory includes an organic semiconductor.

Embodiments of the invention further include a method of electronically storing and reading information utilizing embodiments of the apparatus described herein. As used herein "information" includes digital information, data and/or logic. In an exemplary embodiment of the invention, information is stored in, or read from, an FET coupled to a circuit. The circuit has an output coupled to the FET gate wherein the gate includes a gate contact, a dielectric layer and a path from the gate contact to the dielectric layer. The dielectric layer has at least a portion comprising an organic dielectric. The method includes storing a charge in the dielectric layer by the circuit supplying one or more storage voltage pulses to the dielectric layer.

The electronically stored information may be all or partially erased by dissipating at least some charge stored in the gate dielectric. Dissipation to erase information may be accomplished in any of the ways described herein.

In an illustrative embodiment of the invention, the method of storing and reading information, utilizes a memory cell wherein the transistor is an information storage device of the cell. Additional embodiments include information storage and reading utilizing a transistor having an organic semiconductor.

While the invention has been described by illustrative embodiments, additional advantages and modifications will occur to those skilled in the art. Therefore, the invention in its broader aspects is not limited to specific details shown and described herein. Modifications, for example, to the circuit configuration, dielectric and semiconductor materials, and voltage values, may be made without departing from the spirit and scope of the invention. Accordingly, it is intended that the invention not be limited to the specific illustrative embodiments but be interpreted within the full spirit and scope of the appended claims and their equivalents.

What is claimed is:

1. An apparatus, comprising:
   a field effect transistor having a semiconductor layer, a gate contact and a dielectric layer, the dielectric layer being in contact with said semiconductor layer and separating said semiconductor layer from said gate contact, and at least a portion of said dielectric layer being an organic dielectric;
   a circuit having an output coupled to the gate contact, the circuit configured to produce one or more storage voltage pulses;
   wherein said semiconductor layer has a conductive channel, the conductive channel including an organic semiconductor;
   wherein a charge is stored in said dielectric layer responsive to said voltage pulses;
   wherein a conductivity of said conductive channel is responsive to a voltage applied to said gate contact; and
   wherein the conductivity is responsive to said stored charge.

2. The apparatus of claim 1 wherein the charge is stored in at least a portion of the dielectric layer.

3. The apparatus of claim 1, wherein the FET further comprises a source and a drain, and the conductivity of a conductive path between the source and the drain for a given gate voltage is changed in response to storing a charge.

4. The apparatus of claim 1, wherein the dielectric layer includes a charge storage layer.

5. The apparatus of claim 4, wherein the charge storage layer is selected from the group consisting of cyclin olefin copolymer, glass resin, poly (4 methylstyrene), $TiO_2$-siloxane composites, zinc octaethylporphyrin films, antracene-methacrylate copolymers, poly (methylmathacrylate), poly-tetrafloureothethyene, copolymers of substituted styrenes, and composites of polymers with particles or pores that retain static charges.

6. The apparatus of claim 1 wherein the dielectric layer includes a semiconductor interface layer.

7. The apparatus of claim 6, wherein the semiconductor interface layer is selected from the group consisting of glass resin, self assembled monolayer and polymer.

8. The apparatus of claim 1, wherein at least a portion of the dielectric layer is hydrophobic.

9. The apparatus of claim 1, further comprising:
   a memory cell, the transistor being an information storage device of the cell.

10. The apparatus of claim 1, wherein the FET further comprises an organic semiconductor layer.

11. The apparatus of claim 10, wherein the organic semiconductor is selected from the group consisting of phenylene-thiophene oligomers, NTCDI compounds, thiophene-thiazole oligomers, and benzodithiophene-based compounds.

12. The apparatus of claim 10, wherein the organic semiconductor is selected from the group consisting of phenylene oligomers and co-oligomers and copolymers of thiophene and fluorene.

13. The apparatus of claim 1, wherein the circuit is configured to produce one or more dissipation voltage pulses that cause dissipation of charge stored in the gate dielectric, the one or more dissipation pulses having a voltage of opposite sign to the one or more storage pulses.

14. The apparatus of claim 13, wherein the one or more storage and the one or more dissipation voltage pulses correspond to voltages whose magnitudes are at least three times as large as a voltage that causes a channel in the field effect transistor to conduct.

15. The apparatus of claim 1, wherein the circuit is configured to produce one or more types of energy that cause dissipation of charge stored in the gate dielectric.

16. The apparatus of claim 15, wherein the energy is in a form selected from the group consisting of heat and light.

17. The apparatus of claim 1, wherein the field effect transistor further comprises a channel and the circuit is configured to produce a voltage pulse that changes the conductivity of the channel by at least a factor of ten.

18. The apparatus of claim 1, wherein the organic gate dielectric has a thickness and the circuit is configured to produce a voltage pulse, and wherein the ratio of the voltage to the thickness is in the range of about $10v/1\ \mu$ to about $200v/1\ \mu$.

19. The apparatus of claim 1, wherein the circuit is selected from the group consisting of CMOS compatible floating gate elements, analog memory elements, capacitor-based circuits, adaptive circuits, learning networks and pixel.

20. The apparatus of claim 1, wherein charge is implanted in the dielectric layer by microcontact printing.

21. A method of electronically storing and reading information, comprising the steps of:
providing an organic field effect transistor having a organic semiconductor layer, a gate contact, and a dielectric layer, the dielectric layer being in contact with said semiconductor layer and separating said semiconductor layer from said gate contact, said semiconductor layer having a conductive channel, and at least a portion of said dielectric layer being an organic dielectric;
providing a circuit having an output coupled to the gate contact; and
supplying one or more storage voltage pulses to the dielectric layer, wherein a charge is stored in said dielectric layer, responsive to said voltage pulses, and wherein a conductivity of said conducting channel is responsive to a voltage applied to said gate and wherein the conductivity is responsive to said stored charge.

22. The method of claim 21, wherein the transistor is an information storage device of a memory cell, and the method further comprises:
storing information in the transistor.

23. The method of claim 21, further comprising:
erasing at least some stored information by dissipating at least some charge stored in the gate dielectric.

24. The method of claim 23, wherein the stored charge is dissipating by the circuit providing one or more dissipation voltage pulses, the one or more dissipation pulses having a voltage of opposite sign to the one or more storage pulses.

25. The method of claim 23, wherein the stored charge is dissipated by the circuit providing one or more types of energy.

26. An apparatus, comprising:
a field effect transistor having a semiconductor layer, a gate contact, and a dielectric layer, the dielectric layer comprising a semiconductor interface layer through which said dielectric layer is in contact with said semiconductor layer and separating said semiconductor layer from said gate contact, at least a portion of said dielectric layer being an organic dielectric;
a circuit having an output coupled to the gate contact, the circuit configured to produce one or more storage voltage pulses;
wherein said semiconductor layer has a conductive channel;
wherein a charge is stored in said dielectric layer responsive to said voltage pulses;
wherein a conductivity of said conductive channel is responsive to a voltage applied to said gate contact; and
wherein the conductivity is responsive to said stored charge.

27. The apparatus of claim 26, wherein the semiconductor interface layer is selected from the group consisting of glass resin, self assembled monolayer and polymer.

28. An apparatus, comprising:
a field effect transistor having an organic semiconductor layer, a gate contact, and a dielectric layer, the dielectric layer being in contact with said semiconductor layer and separating said organic semiconductor layer from said gate contact, at least a portion of said dielectric layer being an organic dielectric;
a circuit having an output coupled to the gate contact, the circuit configured to produce one or more storage voltage pulses;
wherein said organic semiconductor layer has a conductive channel;
wherein a charge is stored in said dielectric layer responsive to said voltage pulses;
wherein a conductivity of said conductive channel is responsive to a voltage applied to said gate contact; and
wherein the conductivity is responsive to said stored charge.

29. The apparatus of claim 28, wherein the organic semiconductor is selected from the group consisting of phenylene-thiophene oligomers, NTCDI compounds, thiophene-thiazole oligomers, and benzodithiophene-based compounds.

30. The apparatus of claim 28, wherein the organic semiconductor is selected from the group consisting of phenylene oligomers and co-oligomers and copolymers of thiophene and fluorene.

31. An apparatus, comprising:
a field effect transistor having a semiconductor layer, a gate contact, and a dielectric layer, the dielectric layer being in contact with said semiconductor layer and separating said semiconductor layer from said gate contact, at least a portion of said dielectric layer being an organic dielectric;

a circuit having an output coupled to the gate contact, the circuit configured to produce one or more storage voltage pulses and one or more dissipation voltage pulses that cause dissipation of charge stored in the gate dielectric, the one or more dissipation pulses having a voltage of opposite sign to the one or more storage pulses;

wherein said semiconductor layer has a conductive channel;

wherein a charge is stored in said dielectric layer responsive to said voltage pulses;

wherein a conductivity of said conductive channel is responsive to a voltage applied to said gate contact;

wherein the one or more storage and the one or more dissipation voltage pulses correspond to voltages whose magnitudes are at least three times as large as a voltage that causes a channel in the field effect transistor to conduct; and wherein the conductivity is responsive to said stored charge.

* * * * *